(12) United States Patent
Soefker

(10) Patent No.: US 9,357,661 B2
(45) Date of Patent: May 31, 2016

(54) MODULE UNIT WITH CIRCUIT BOARD RECEIVING ELEMENT

(75) Inventor: Joerg Soefker, Lemgo (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 579 days.

(21) Appl. No.: 13/516,756

(22) PCT Filed: Dec. 17, 2010

(86) PCT No.: PCT/EP2010/007723
§ 371 (c)(1),
(2), (4) Date: Jun. 18, 2012

(87) PCT Pub. No.: WO2011/082799
PCT Pub. Date: Jul. 14, 2011

(65) Prior Publication Data
US 2012/0261540 A1    Oct. 18, 2012

(30) Foreign Application Priority Data
Dec. 17, 2009   (DE) .......................... 10 2009 059 010

(51) Int. Cl.
*H05K 5/00* (2006.01)
*H02B 1/052* (2006.01)
*H05K 7/14* (2006.01)

(52) U.S. Cl.
CPC .............. *H05K 5/0013* (2013.01); *H02B 1/052* (2013.01); *H05K 7/142* (2013.01); *Y10T 83/04* (2015.04)

(58) Field of Classification Search
CPC .............. G06F 1/183–1/187; G01R 13/62911; G01R 12/721; G01R 9/2675; H05K 7/1468; H02B 1/052

USPC ............ 248/27.1, 27.3, 346.03, 188.1, 188.8, 248/346.01, 688; 361/730, 748, 728, 736, 361/752, 753, 724
See application file for complete search history.

(56) References Cited

U.S. PATENT DOCUMENTS

| | | | |
|---|---|---|---|
| 4,261,940 A | | 4/1981 | Bussey |
| 4,547,236 A | | 10/1985 | McCartney |
| 4,700,846 A | * | 10/1987 | Schroder .................... 211/41.17 |
| 5,206,972 A | | 5/1993 | Nudelmont et al. |
| 5,602,363 A | * | 2/1997 | Von Arx ........................ 174/559 |
| 5,754,412 A | * | 5/1998 | Clavin .......................... 361/804 |
| 6,172,877 B1 | * | 1/2001 | Feye-Hohmann et al. ... 361/759 |
| 6,224,429 B1 | * | 5/2001 | Bernhards et al. ............ 439/709 |
| 7,230,821 B2 | * | 6/2007 | Skofljanec et al. ...... 361/679.08 |
| 7,898,819 B2 | * | 3/2011 | Pfingsten et al. ............. 361/800 |
| 8,549,741 B2 | * | 10/2013 | Nelson et al. ................... 29/834 |
| 2009/0083980 A1 | | 4/2009 | Pfeuffer et al. |
| 2010/0014224 A1 | | 1/2010 | Smirra |

FOREIGN PATENT DOCUMENTS

| | | |
|---|---|---|
| DE | 3011243 A1 | 10/1981 |
| DE | 19924344 A1 | 12/2000 |

(Continued)

OTHER PUBLICATIONS

European Patent Office, International Search Report in International Patent Application No. PCT/EP2010/007723 (Jul. 27, 2011).

*Primary Examiner* — Nkeisha Smith
(74) *Attorney, Agent, or Firm* — Leydig, Voit & Mayer, Ltd.

(57) ABSTRACT

A module unit includes a receiving element formed from an extrusion profile and configured to receive at least one circuit board. The receiving element includes at least two recesses. Two lateral elements are each configured to be received in a respective one of the at least two recesses so as to fasten the lateral elements to the receiving element by latching.

10 Claims, 8 Drawing Sheets

(56) References Cited

FOREIGN PATENT DOCUMENTS

| DE | 20004263 | U1 | 1/2001 |
|---|---|---|---|
| DE | 10256254 | A1 | 6/2004 |
| DE | 202004012462 | U1 | 10/2004 |
| DE | 102005043055 | B3 | 12/2006 |
| DE | 102008007147 | A1 | 8/2009 |
| EP | 0241074 | A2 | 10/1987 |
| EP | 1137334 | A2 | 9/2001 |
| WO | 2008009491 | A1 | 1/2008 |

* cited by examiner

MODULE UNIT WITH CIRCUIT BOARD RECEIVING ELEMENT

CROSS-REFERENCE TO PRIOR APPLICATIONS

This application is a U.S. National Phase application under 35 U.S.C. §371 of International Application No. PCT/EP2010/007723, filed on Dec. 17, 2010, and claims benefit to German Patent Application No. DE 10 2009 059 010.2, filed on Dec. 17, 2009. The International Application was published in German on Jul. 14, 2011 as WO 2011/082799 under PCT Article 21(2).

FIELD

The invention relates to a module unit with a receiving element for receiving one or more circuit boards and two lateral elements, which can be arranged on the receiving element, the module unit being able to be fastened on a support rail or by means of fastening flange directly on an assembly plate. Furthermore, the invention relates to a method for producing receiving elements for module units.

BACKGROUND

A module unit generally has a receiving element in the form of a trough-shaped carrier element, within which, as required, one or more circuit boards can be inserted in holding elements provided on the receiving element. The circuit boards are generally, in this case, surrounded in a U-shape by the holding elements in groove-shaped regions on two lateral regions of the circuit boards running in the direction of the longitudinal axis of the circuit boards. In order to prevent the circuit boards slipping out of the holding elements and therefore out of the receiving element, a lateral element is in each case screwed on the receiving element by means of screws at the two open lateral regions of the receiving element, via which the circuit boards can be inserted in the receiving element.

The drawback here is that, since to produce the module unit, the lateral elements have to be screwed to the receiving element, an additional manufacturing step and also additional fastening elements in the form of screws are necessary, so assembly of the module unit is complex and time-consuming.

SUMMARY

In an embodiment, the present invention provides a module unit. A receiving element is formed from an extrusion profile and configured to receive at least one circuit board. The receiving element includes at least two recesses. First and second lateral elements are each configured to be received in a respective one of the at least two recesses so as to fasten the lateral elements to the receiving element by latching.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
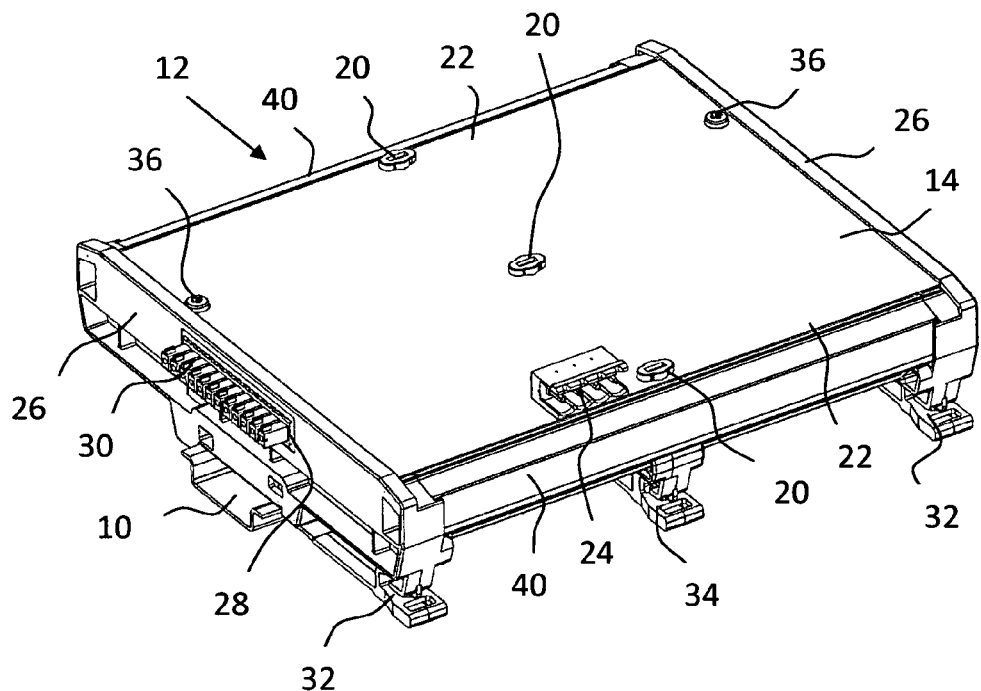
FIG. 1 shows a schematic view of a module unit according to an embodiment of the invention fastened on a support rail.

In an embodiment, the invention provides a solution which is distinguished by simplified and faster assembly of a module unit.

In a module unit of the type mentioned in more detail at the outset, an embodiment of the present invention provides that the receiving element is formed from an extrusion profile, the receiving element having at least two recesses, within which the lateral elements can be fastened to the receiving element by latching.

In a method of the type described in more detail at the outset, an embodiment of the present invention provides that receiving elements are cut to length from an extrusion profile, recesses being introduced into the receiving elements at the same time as they are cut to length.

Since the receiving element is formed from an extrusion profile, the receiving element, as required, can be configured in any lengths. Depending on the module length desired by the user and the space required or available for the module unit, the receiving element configured as an extrusion profile can be individually cut to length. For example, this makes an optimal adaptation of the module unit to the dimensions of the circuit boards received by the receiving element possible, so a large number of electronic circuits can be realised in a manner mountable on rails. The receiving element may, in this case, be produced both from a plastics material and from a metal, preferably aluminium. If the receiving element has a relatively short length, the receiving element is preferably produced from a more economical plastics material, for example polyvinyl chloride and/or from a more temperature-resistant plastics material, for example polyamide. When there are longer lengths of the receiving element, the receiving element is preferably produced from a metal, as a receiving element produced from a metal has greater dimensional stability.

According to an embodiment of the invention, the lateral elements are no longer fastened to the receiving element by means of screws, as is known from the prior art, but by means of recesses which are provided on the receiving element configured as an extrusion profile, and into which the lateral elements can be quickly and easily latched. The assembly, during which the lateral elements are pushed onto the receiving element, and the subsequent fastening of the lateral elements to the receiving element can therefore now take place in one manufacturing step. Additional fastening elements, such as, for example, screws, are no longer necessary because of the fastening by means of latching, so both the assembly outlay and the assembly time of a module unit of this type can be substantially reduced compared to known module units.

The recesses are preferably introduced, in this case, into the extrusion profile by means of mechanical machining, for example by means of sawing, drilling and/or milling, once the extrusion profile has been completely formed by extrusion. The recesses, in this case, may be provided in any desired manner along the peripheral face of the receiving element. The recesses are advantageously introduced into the receiving element in one manufacturing step at the same time as the cutting to length of the receiving element to the desired length, so the manufacturing costs can be reduced. For this purpose, a saw device may be used, for example, in particular a circular saw device, which is modified in such a way that, with two additional saw blades during the cutting to length of the receiving element, it can at the same time, in each case, produce a recess for one end of the receiving element to be cut to length and for a start of the next receiving element, in that, in addition to a main saw blade, which is used to cut the receiving element to length, an additional saw blade is, in each case, arranged to the right and left of the main saw blade on the saw, the main saw blade being adjusted such that it has a larger incision depth than the two additional saw blades to the right and left of the main saw blade. According to a preferred configuration of the invention, it is therefore provided that a saw device is used for cutting to length and for introducing the recesses, receiving elements being cut to length from the extrusion profile by a main saw blade of the saw device and a recess being introduced, in each case, at one end of the receiving element cut to length and at a start of a next receiving element to be cut to length by two additional saw blades provided on the saw device. The recesses are preferably introduced, in this case, in the form of preferably elongate, groove-shaped recesses into the receiving element transverse to the push-on direction of the lateral elements onto the receiving element. The receiving element, in this case, preferably has two mutually opposing end portions for fastening the two lateral elements, one or more of the recesses being introduced in the region of these two end portions, in each case. At these two end portions provided with recesses, a lateral element can be joined to the two end portions, in each case, once the recesses have been introduced into the extrusion profile and once one or more circuit boards have been received, in that the lateral elements are pushed onto the end portions and can easily latch within the recesses without additional aids being necessary for this.

According to a preferred configuration of the invention, the lateral elements have latching means for fastening the lateral elements within the recesses of the receiving element. The latching means are preferably resilient. One latching means, in this case, preferably has an elongate spring arm, which is flexible. A latching hook, which can engage in a recess on the receiving element, is preferably configured at a free end of the spring arm. The elongate spring arm allows a movement of the latching hook, so the latter can hook into the recess when the latching means is pushed onto the receiving element and, if required, can be unhooked again from the recess by means of a tool. By providing a latching means on the lateral elements, the lateral elements can positively latch in the recesses on the receiving elements in order to easily be able to detachably connect the lateral elements to the receiving element, in particular by the resilient configuration of the latching means.

It is furthermore preferably provided that the receiving element has a web element, onto which the lateral elements can in each case be pushed by means of a guide element provided on the lateral elements. The web element is preferably formed on a base plate of the receiving element. The receiving element preferably has more than one web element and the lateral elements in each case have more than one guide element. Since the lateral elements can be pushed by means of guide elements onto web elements provided on the receiving element, a targeted positioning and guidance of the lateral elements can be realised during assembly of the lateral elements on the receiving element. The web element is preferably T-shaped, in this case. The guide element is preferably configured in such a way that it can at least partially encompass the web elements, so the guide element cannot inadvertently slip from the web element. The guide element is preferably, in this case, configured in a U-shape with inwardly bent end portions, so the guide element can reliably encompass the preferably T-shaped web element.

The recesses of the receiving element are provided, in this case, according to a preferred configuration of the invention, in the region of the web element and the latching means of a lateral element are provided in the region of the guide element. The recesses are accordingly preferably not provided on the base plate of the receiving element, as this would cause a weakening of the receiving element, but the recesses are introduced into the web element provided on the base plate of the receiving element. The web element is preferably configured with its longitudinal axis in the insertion direction of the circuit board, the recesses preferably being introduced into the web element transverse to the longitudinal axis of the web element. The latching means provided to latch the lateral elements on the receiving element are preferably configured in the region of the guide element provided on the lateral elements, preferably positioned within the U-shaped guide element, so that when the guide element is pushed onto the web element, after a certain path has been covered, the guide element can latch in the recess provided on the web element by means of the latching hook arranged on the latching means, so a secure fixing of the lateral elements on the receiving element can be realised.

It is preferably provided that a first circuit board and a second circuit board are provided, the receiving element having two holding elements to receive the first and the second circuit board. The two holding elements are preferably formed, in this case, in such a way that the first circuit board is surrounded in a U-shape on two opposing lateral regions of the first circuit board by one of the two holding elements, in each case and the second circuit board rests with two mutually opposing lateral regions of the second circuit board on the two holding elements. The first circuit board is preferably provided, in this case, between the base plate of the receiving element and the second circuit board, the base plate, the first circuit board and the second circuit board being arranged parallel to one another. The second circuit board is accordingly the circuit board which is arranged furthest from the base plate of the receiving element within the receiving element. It is also possible to provide further circuit boards between the first circuit board and the second circuit board. The holding elements are preferably configured in the form of elongate profile rails, which extend in the insertion direction of the circuit boards along the longitudinal axis of the receiving element. The holding elements are arranged in an opposing manner on two edge regions of the receiving element on the base plate of the receiving element, the holding elements extending with their cross-sectional area orthogonally with respect to the base plate of the receiving element. The holding elements have a plurality of portions, in which the various circuit boards can be arranged. The portion of one holding element, in which the first circuit board can be inserted, is preferably configured in a U-shape in the form of a groove, so the lateral region of the first circuit board inserted in this portion is at least partially surrounded by the U-shaped portion, so the first circuit board can be secured against falling out of the receiving element by means of this portion. The portion of a holding element, which is arranged furthest from the base plate of the receiving element, is preferably L-shaped, so the circuit board introduced into this portion, in this case, the second circuit board, is placed on and guided with its lateral region introduced in the portion and is not secured against falling out by the holding element or a portion of the holding element. The second circuit board arranged in this portion is secured against falling out by the lateral elements joined to the receiving element, in that the lateral elements at least partially engage over the second circuit board.

In the holding elements known until now, all the circuit boards provided in the holding elements were encompassed in a U-shape at their lateral regions, in that the circuit boards were guided in lateral grooves provided on the holding element. However, it is therefore not possible to completely use the entire surface of the circuit board, as one part of the circuit board was until now always covered by the holding element. Since it is now possible in the module unit according to an embodiment of the invention for at least the circuit board, which is arranged furthest from the base plate of the receiving element, to no longer be covered by the holding element, the entire surface of this circuit board, regardless of the positioning in the receiving element, can be used for the arrangement of terminals, for example terminal clamps, on the surface of the circuit board. The terminals can therefore be arranged up to the edge regions of the circuit board, which adjoin the holding elements. In addition, the handling of the attachment of terminals on the circuit board can thus be substantially simplified, as the holding element no longer forms an additional edge projecting from the circuit board, which firstly has to be overcome by the terminal before the terminal can be fastened to the circuit board.

According to a further advantageous configuration of the invention, the two holding elements in each case have at least one hollow chamber profile, within which, in each case, a rib element provided on the lateral elements can be inserted. The lateral elements preferably in each case have a rib element, which can be inserted in the hollow chamber profile of the holding element during the fastening of the lateral elements on the receiving element. The rib element is, in this case, preferably configured in such a way that it can be inserted without play into the hollow chamber profile. Since a rib element provided on the lateral elements can be inserted in a hollow chamber profile of the holding element, the stability of the fastening of the lateral elements on the receiving element can be substantially increased as the lateral elements can thus, in particular, be prevented from tilting from the receiving element. Owing to the configuration as a hollow chamber profile, the stability of the lateral elements themselves and the stability of the fastening of the lateral elements to the receiving element can be increased.

It is furthermore preferably provided that at least one fastening element is provided to fasten one or more circuit board to the receiving element. The fastening element is used to prevent the circuit boards, in particular the second circuit board, which rests on the L-shaped portion of the holding element, from being able to fall out of the receiving element. In addition, the fastening element can compensate the forces acting on the circuit boards, which can be caused by terminals arranged on the circuit board. The fastening element is preferably configured in such a way, in this case, that it can be fastened both to the circuit board and to the receiving element.

The fastening element, according to an advantageous configuration of the invention, can be guided through a through-opening provided on the circuit board and fastened by means of a holding element provided on the fastening element by a rotary movement of the fastening element on a surface of the at least one circuit board. The fastening element preferably has an elongate shaft, on which one or more holding elements are arranged. The through-opening is preferably configured as an elongate hole, through which the shaft and the holding element of the fastening element can be guided to fasten the fastening element. The holding element can be rotated with respect to the through-opening by a rotary movement of the fastening element within the through-opening in such a way that it can no longer be guided through the through-opening, but comes to rest on the circuit board and can be fastened to the surface of the circuit board, for example by clamping on. The holding element therefore brings about a clamping of the circuit board between the holding element and the receiving element. If a plurality of circuit boards are arranged in the receiving element, the circuit boards preferably in each case have a through-opening, which through-openings are arranged one above the other, aligned with respect to one another, so the fastening element can be guided with its shaft through the through-holes arranged one above the other. The fastening element can, in this case, have one holding element per circuit board. The individual holding elements are, in this case, preferably arranged at a specific spacing from one another on the shaft, the spacing preferably corresponding to the spacing of the circuit boards with respect to one another. To fasten the fastening element, the latter is firstly guided through the through-holes, the fastening element, in this case, being rotated in such a way that the holding elements can be guided through the through-holes. If the fastening element has reached its final position, the fastening element can preferably be rotated through an angle of 90°, so the individual holding elements come to rest on the respective circuit boards and therefore allow the circuit boards to be fixed. In the region of the fastening of the fastening element to the receiving element, the fastening element preferably has a latching element, which, in the region of the receiving element, can hook or latch, for example, in an undercut in the region of the base plate of the receiving element by a 90° rotation of the fastening element in order to prevent rattling or rotating/turning loose. The fastening element is preferably configured as a square on its shaft in the region of the latching element. The fastening element is preferably prevented from rotating in that the diagonal measurement of the square on the shaft of the fastening element is greater than the width measurement of the receiving element in the region of the fastening of the latching element. On rotation of the fastening element, the receiving element therefore deforms flexibly in the region of the excess and thus brings about the prevention of rotation, which is possible in that the receiving element is preferably produced from a flexible plastics material. This principle of preventing rotation can preferably also be applied in the holding elements provided on the shaft of the fastening element. The fastening element can, in this case, be fastened as desired in the longitudinal direction of the receiving element or in the support rail direction on the circuit board or on the receiving element, more than one fastening element preferably being provided to fasten the circuit board.

It is furthermore preferably provided that at least one of the lateral elements has an opening. A plug connector arrangement may, for example, be provided on this opening, by means of which it is possible to be able to allow a bus connection between two or more module units.

Furthermore, it is preferably provided that one or more potential earth contact elements are provided. The potential earth contact elements may be fastened on one of the circuit boards and be connected to the support rail fastened to the receiving element. The length of a potential earth contact element can be configured as desired depending on, on which circuit board the potential earth contact element is arranged.

To fasten the receiving element and/or a lateral element on a support rail, a foot element is provided according to a further preferred configuration of the invention. The foot element may be formed directly on a lateral element and/or be configured as a separate component, which can be fastened to the receiving element. The configuration of the foot element as a separate component is, in particular, advantageous when the receiving element is so long that it can easily bend. The separate component may be fastened at any time to the receiving element, without the lateral elements having to be firstly removed for this purpose from the receiving element. The foot element configured as a separate component can be arranged between the receiving element and the support rail, the foot element, in this case, preferably being configured in such a way that it can be hooked in the web element configured on the receiving element. The foot element can then be fixed to the support rail by means of, for example, a locking element pivotably arranged on the foot element. The foot element configured as a separate component is, in this case, preferably latched with its longitudinal axis transverse to the longitudinal axis of the support rail on the support rail and the receiving element.

Figure 2:
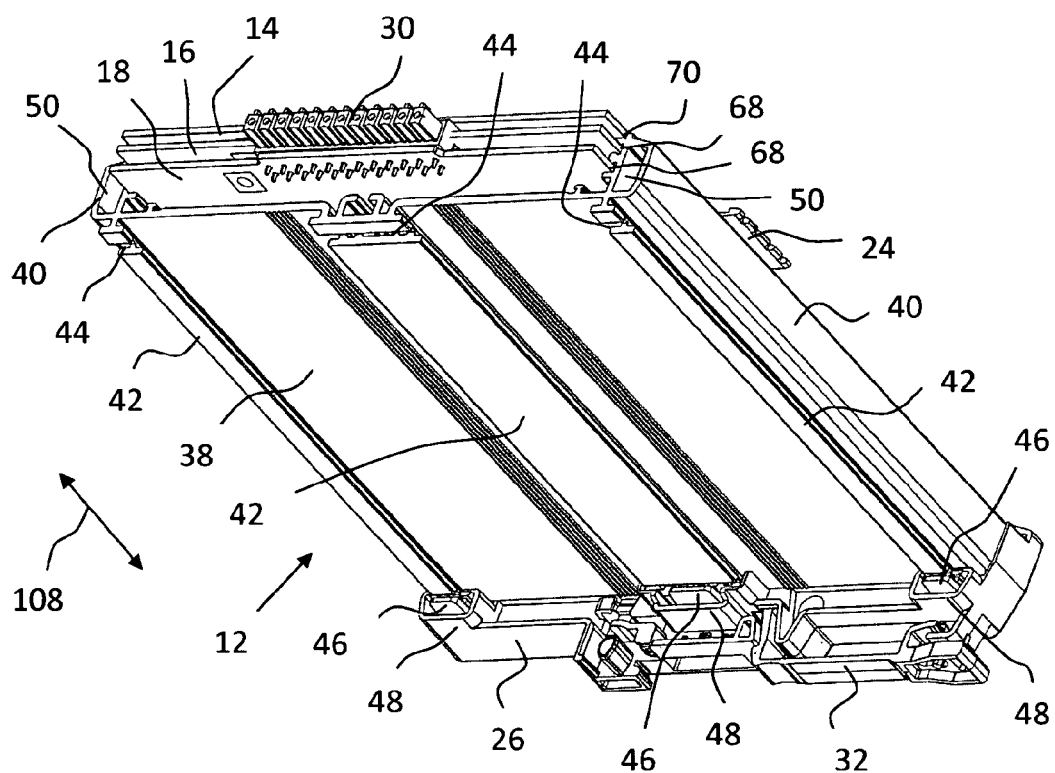
FIG. 2 shows a schematic view of a receiving element according to an embodiment of the invention and a lateral element arranged thereon.

FIG. 1 shows a module unit according to an embodiment of the invention, which is fastened to a support rail 10. The module unit has a trough-shaped receiving element 12, as can be seen in FIG. 2, to receive at least one circuit board 14, the receiving element 12 being configured as an extrusion profile. The receiving element 12 is limited on its two longitudinal sides by a respective holding element 40, which has a plurality of insertion regions or portions 68, 70, in which the circuit boards 14 are inserted for fastening to the receiving element 12.

The module unit shown in FIG. 1 has three circuit boards 14, 16, 18, which are inserted in the receiving element 12 one above the other, as can be seen in FIG. 2. Only the second circuit board 14, which is the uppermost circuit board, and therefore upwardly terminates the receiving element 12 or the module unit, can be seen in FIG. 1. This second circuit board 14 rests on the holding elements 40 and is fastened to the receiving element 12 by means of three fastening elements 20. Since the second circuit board 14 rests on the holding elements 40 and is not covered toward the top at its lateral regions 22 by the holding elements 40, it is possible to arrange terminals 24, for example terminal clamps, up to the edge of the lateral regions 22 of the circuit board 14, as shown in FIG. 1, so that a larger region of the surface of the circuit board 14 can be used for terminals 24. In the example shown here, fastening elements 20 are provided on the lateral regions 22 and in the center of the circuit board 14.

In order to prevent the circuit boards 14, 16, 18 slipping out of the receiving element 12, a lateral element 26 is provided, in each case, on the two transverse sides of the receiving element 12. The lateral elements 26 may be pushed onto the receiving element 12 and fastened there by latching on the receiving element 12. The lateral elements 26 are configured in such a way that they partially engage over the second circuit board 14 and thereby prevent the circuit board 14 from falling out of the receiving element 12.

The lateral elements 26 may have one or more openings 28, in which, for example, a plug connector arrangement 30, as shown in FIG. 1, can be arranged to be able to connect one module unit to another module unit.

The lateral elements 26 in each case have a foot element 32, by means of which the lateral elements 26 and therefore the module unit can be fastened to a support rail 10. In addition to the foot elements 32 on the lateral elements 26, a foot element 34 can be provided as a separate component, which can be fastened between the receiving element 12 and the support rail 10.

Furthermore, as shown in FIG. 1, potential earth contact elements 36 may be provided, which are fastened to a circuit board 14 and are connected to the support rail 10 fastened to the receiving element 12.

FIG. 2 shows an as yet incompletely assembled module unit. The receiving element 12 of the module unit is formed from a base plate 38 and two holding elements 40 arranged on the base plate 38. Configured on the base plate 38, in particular on the lower side of the base plate 38, are three web elements 42, which extend with their longitudinal axis along the insertion direction 108 of the circuit boards 14, 16, 18, two web elements 42 being provided on the edge regions of the receiving element 12 and one web element 42 being provided centrally on the receiving element 12. Groove-shaped recesses 44 extending transverse to the longitudinal axis of the web elements 42 are introduced in the web elements 42. Latching means 46 provided on the lateral elements 26 can be latched into the groove-shaped recesses 44 in that the lateral elements 26 are pushed onto the receiving element 12. To push the lateral elements 26 on in a targeted manner, the latter have guide elements 48, which can be pushed onto the web elements 42. The web elements 42 are T-shaped, in this case, and the guide elements 48 are U-shaped with inwardly bent end regions, so the guide elements 48 can at least partially encompass the web elements 42. The latching means 46 are configured within the guide elements 48

Figure 3:
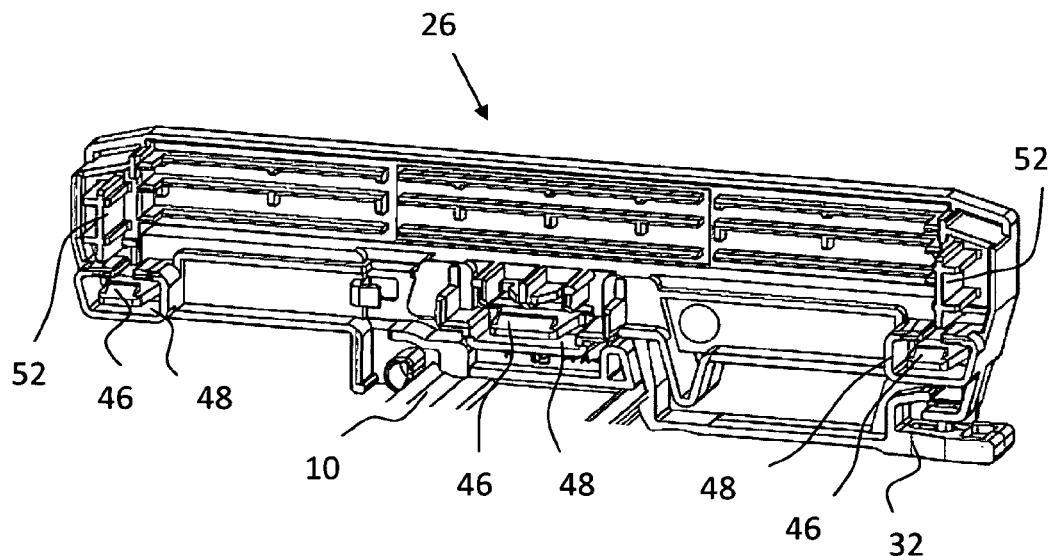
FIG. 3 shows a first schematic view of a lateral element.

The holding elements 40, which are preferably extruded in one piece together with the base plate 38, in each case have a hollow chamber profile 50, in which rib elements 52 provided on the lateral elements 26, as shown in FIG. 3, can engage, and can thereby improve the stability of the connection of the lateral elements 26 on the receiving element 12.

Furthermore, the holding elements 40 have insertion portions 68, 70, in which the individual circuit boards 14, 16, 18 can be inserted or placed. The two holding elements 40 are, in this case, preferably formed in such a way that the first circuit board 18 and the third circuit board 16 are surrounded in a U-shape on two opposing lateral regions of the first circuit board 18 or the third circuit board 16 in each case by one of the two holding elements 40 and the second circuit board 14 with two mutually opposing lateral regions of the second circuit board 14 rests on the two holding elements 26. The portions 68 of a holding element 40, in which the first circuit board 18 and the third circuit board 16 are inserted, is configured in a U-shape in the form of a groove, so the lateral region of the first circuit board 18 and the third circuit board 16 inserted in these portions 68 is, in each case, at least partially surrounded by a U-shaped portion 68, so the first circuit board 18 and the third circuit board 16 are secured by means of these portions 68 against falling out of the receiving element 12. The portion 70 of a holding element 40, which is arranged furthest from the base plate 38 of the receiving element 12, is preferably L-shaped, so the second circuit board 14 introduced in this portion 70 is placed on and guided with its lateral region introduced in the portion 70 and is not secured against falling out by the holding element 40 or a portion 70 of the holding element 40. The second circuit board 14 arranged in this portion 70 is secured by the lateral elements 26 joined to the receiving element 12 against falling out, in that the lateral elements 26 at least partially engage over the second circuit board 14.

Figure 4:
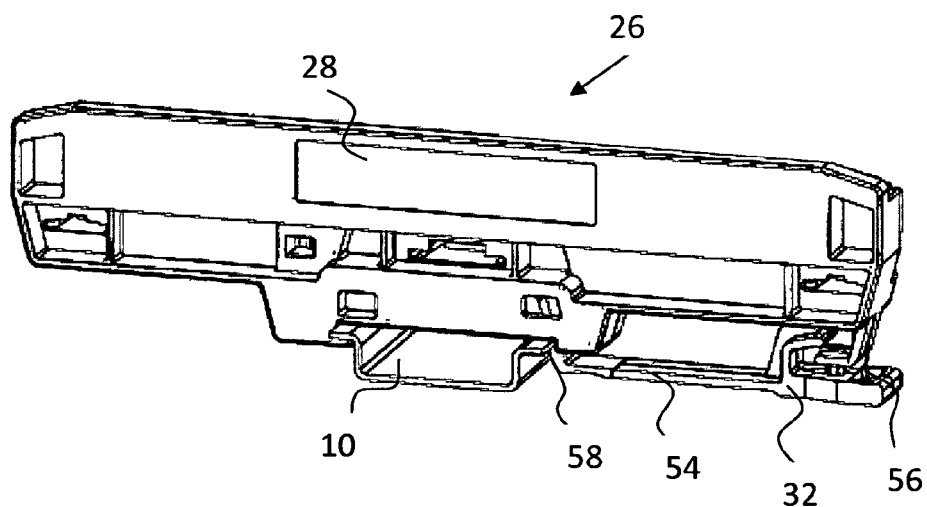
FIG. 4 shows a second schematic view of the lateral element shown in FIG. 3.

FIG. 3 shows a lateral element 26 with the lateral face, by means of which the lateral element 26 can be fastened to the receiving element 12, the rib elements 52, the guide elements 48 and the latching means 46 arranged thereon being arranged on this lateral face. FIG. 4 shows a lateral element 26 with a lateral face, which, in the assembled state, extends away from the receiving element 12. It is possible to see the opening 28 on this lateral element 26, which opening is configured as an aperture point in this example shown here, in order to be able to arrange, for example, a plug connector arrangement 30 on a circuit board 14, 16, 18.

It can furthermore be seen in FIGS. 3 and 4 that the lateral elements 26, on their lower side, have a foot element 32, by means of which the lateral elements 26 can be fastened to a support rail 10. For this purpose, the foot element has a locking element 54, which is pivotably mounted on the lateral element 26. The locking element 54, on its first free end, has an opening 56, by means of which the locking element 54 can be actuated by means of a tool, for example a screwdriver. At its other free end, the locking element 54 has a latching hook 58, the latching hook 58 latching behind a rim of the support rail 10, so the foot element 32 and therefore the lateral element 26 can be clamped onto the support rail 10.

Figure 5:
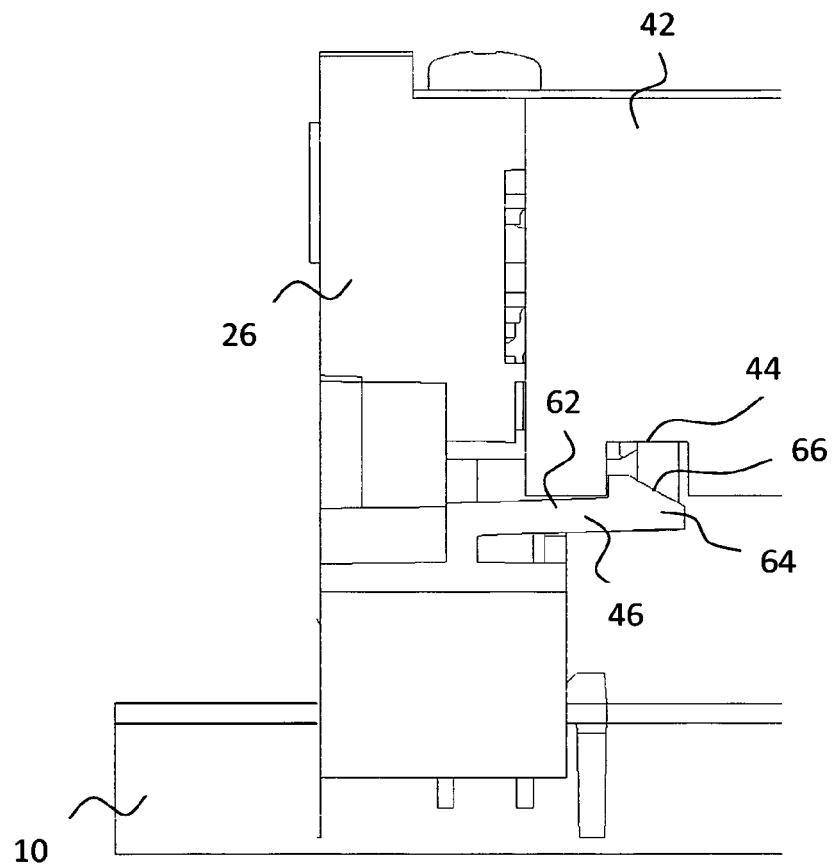
FIG. 5 shows a schematic sectional view of a lateral element fastened to a receiving element.

FIG. 5 shows a sectional view of the fastening of the lateral element 26 on a receiving element 12, the engagement of the latching means 46 in the groove-shaped recess 44 on a web element 42 being shown here, in particular. The latching element 46 is resilient and has an elongate spring arm 62, which, at its free end, has a latching hook 64 with a bevelled face 66. To fasten the latching means 46 in the groove-shaped recess 44, the spring arm 62 is guided along the web element 42, until the latching hook 64 can engage in the recess 44. To release the latching means 46 from the recess 44, the latching hook 64 or the spring arm 62 can be bent downward by means of a tool, which can engage in a gap between the bevelled face 66 and the recess 44 until the latching hook 64 is released from the recess 44. The lateral element 26 can then be withdrawn with the latching means 46 from the web element 42.

Figure 6:
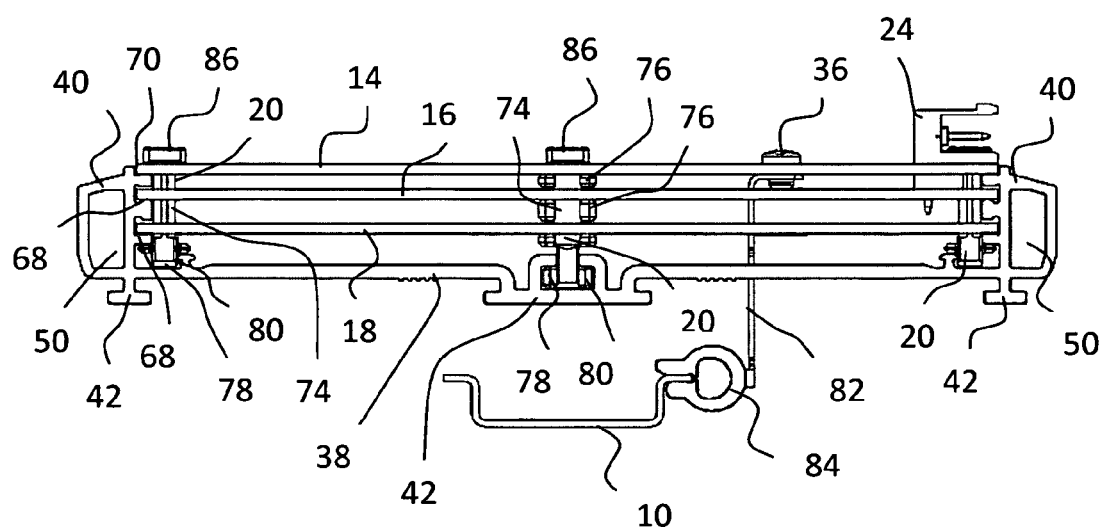
FIG. 6 shows a schematic view of a receiving element with circuit boards arranged thereon.
Figure 8:
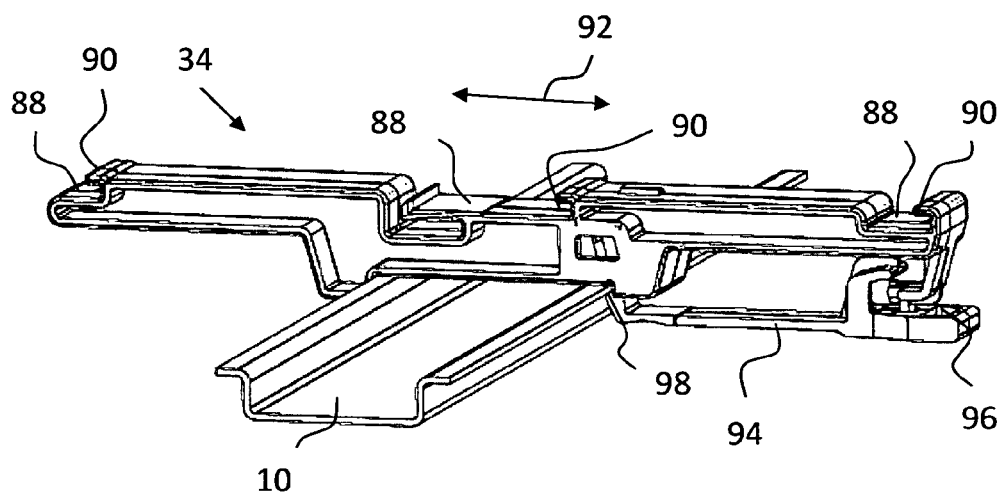
FIG. 8 shows a schematic view of a foot element provided as an additional component, fastened to a support rail.

In FIG. 6, the receiving element 12 is shown with circuit boards 14, 16, 18 arranged therein, said circuit boards being held by means of the portions 68, 70 in the receiving element 12. In addition to this, the circuit boards 14, 16, 18 are fixed with fastening elements 20 on the receiving element 12. To assemble the fastening elements 20, the circuit boards 14, 16, 18 have through-openings 72, which, as can be seen in FIG. 8, are configured as an elongate hole. The fastening element 20 has an elongate shaft 74, on which one or more holding elements 76, 86 are arranged. To fasten the fastening element 20, the shaft 74 and possibly one or more of the holding elements 76 arranged on the shaft 74 can be guided through the through-opening 72. The holding element 86 provided on the free end of the shaft has a larger peripheral face than the remaining holding elements 76, the peripheral face of the holding element 86 being greater than the through-openings 72 in the circuit boards 14, 16, 18, so this holding element 86 cannot be guided through the through-holes 72, but comes to rest on the uppermost circuit board 14 provided in the receiving element 12. This prevents the entire fastening element 20 being able to inadvertently slip completely into the through-openings 72. The holding elements 76 are preferably, in this case, arranged on the shaft 74 offset by an angle of 90° with respect to the holding element 86. By a rotational movement of the fastening element 20 within the through-opening 72, the holding element 76 can be rotated with respect to the through-opening 72 in such a way that it can no longer be guided through the through-opening 72 and therefore comes to rest on one of the circuit boards 14, 16, 18 and is thus clamped on the surface of the respective circuit boards 14, 16, 18. The holding element 76 therefore brings about a clamping of the circuit board 14, 16, 18 between the holding element 76 and the receiving element 12. If a plurality of circuit boards 14, 16, 18, as shown here, are arranged in the receiving element 12, the circuit boards 14, 16, 18 preferably have one through-opening 72 per fastening element 20, in each case, which through-openings are arranged one above the other, aligned with one another, so the fastening element 20 can be guided with its shaft 74 through the through-holes 72 arranged one above the other. The fastening element 20 can, in each case have one holding element 76 here per circuit board 14, 16, 18, as is the case here with the fastening element 20 arranged centrally. The individual holding elements 76 are preferably, in this case, arranged at a specific spacing from one another on the shaft 72, the spacing preferably corresponding to the spacing of the circuit boards 14, 16, 18 from one another. To fasten the fastening element 20, the latter is firstly guided through the through-openings 72, the fastening element 20 being rotated, in this case, in such a way that the holding elements 76 can be guided through the through-openings 72. If the fastening element 20 has reached its final position, the fastening element 20 can preferably be rotated through an angle of 90°, so the individual holding elements 76 can come to rest on the respective circuit boards 14, 16, 18 and thereby allow fixing of the circuit boards 14, 16, 18. In the region of the fastening of the fastening element 20 on the receiving element 12, the fastening element 20 preferably has a latching element 78, which can hook in in the region of the receiving element 12, for example in an undercut 80 on the base plate 38 of the receiving element 12.

In the embodiment shown in FIG. 6, a fastening element 20 is in each case provided on the lateral regions 22 of the circuit boards 14, 16, 18, these fastening elements 20 only clamping the second circuit board 14 by a holding element 76 as the first and the third circuit board 18, 16 are held by the U-shaped portions 68 of the holding elements 40 in their position in the receiving element 12. The fastening element 20 provided in the centre of the circuit boards 14, 16, 18, on the other hand, has a holding element 76, 86 for each of the three circuit boards 14, 16, 18, so all three circuit boards 14, 16, 18 are fixed centrally on the receiving element 12, so rattling noises caused by the circuit boards can be prevented.

Furthermore, a potential earth contact element 36 is shown in FIG. 6, which is fastened to the uppermost circuit board 14 and has a metal arm 82, which is fastened by a clamp 84 to the support rail 10.

Figure 7:
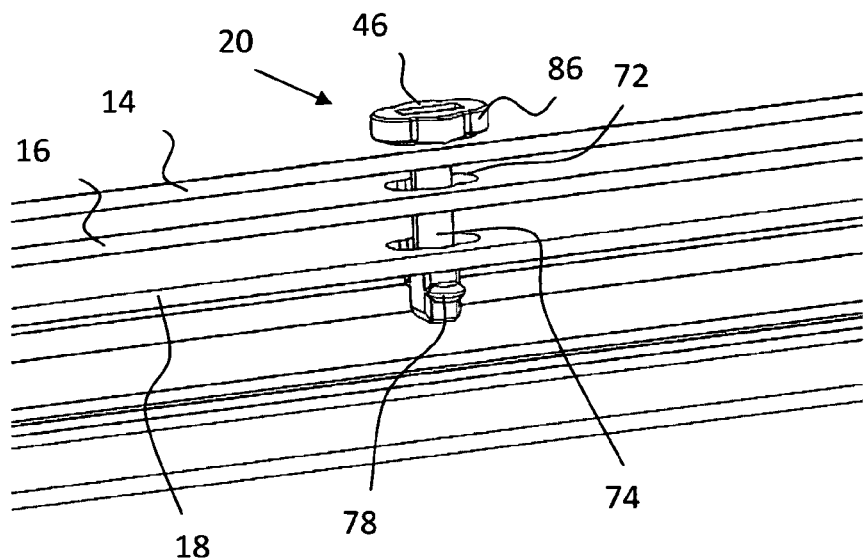
FIG. 7 shows a schematic view of a fastening element provided on the circuit boards.

FIG. 7 shows a detailed view of a fastening element 20 provided on the lateral regions 22 of the circuit boards 14, 16, 18, this fastening element 20 only having one holding element 86, which rests, in the fastened state shown, on the second circuit board 14. The latching element 78, which can engage in an undercut 80 of the receiving element 12, is arranged offset by an angle of 90° with respect to the holding element 86 on the shaft 74.

Figure 9:
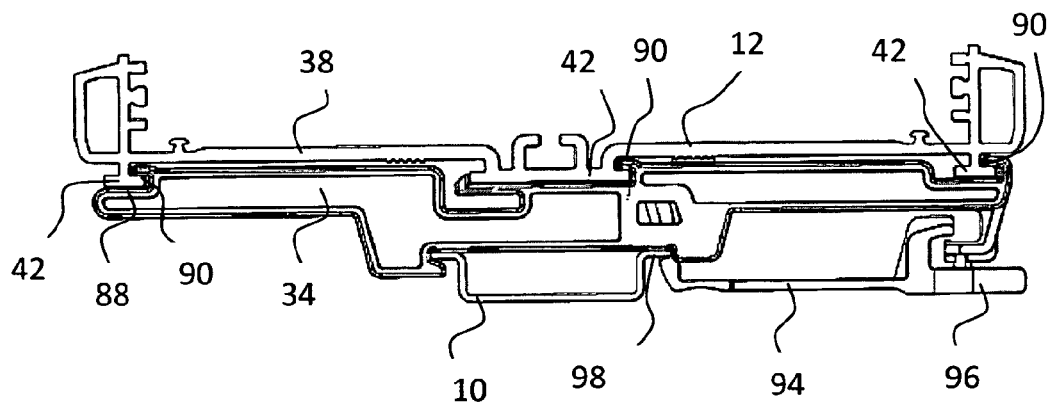
FIG. 9 shows a further schematic view of the foot element shown in FIG. 8, fastened to a receiving element and a support rail.

A foot element 34 in the form of an additional component, which can be used between a receiving element 12 and a support rail 10 to stabilise the module unit on the support rail 10, is shown in FIG. 8 and FIG. 9. The foot element 34 is preferably configured as an elongate, flat profile. The foot element 34 has a plurality of recesses 88, which can engage in the web elements 42 provided on the base plate 38 of the receiving element 12. The recesses 88 for this purpose in each case have an undercut 90, which, by a displacement of the foot element 34 along its longitudinal direction, shown by the arrow 92, can be pushed onto the web elements 42 or pushed off the web elements 42 and can be latched in the pushed-on position in one or more of the recesses 88 of the web elements 42. The foot element 34 is preferably latched in the recess 88 provided centrally on the foot element 34, preferably by means of a latching hook provided in the recess 88. The foot element 34 can be fixed on the support rail 10 by means of a locking element 94 pivotably arranged on the foot element 34. The locking element 94, at its first free end, has an opening 96, by means of which the locking element 94 can be actuated by means of a tool, for example a screwdriver. At its other free end, the locking element 94 has a latching hook 98, the latching hook 98 latching behind a rim of the support rail 10, so the foot element 34 can be clamped onto the support rail 10. The foot element 34 is shown in FIG. 9 in a state in which it is fastened to the receiving element 12 and the support rail 10.

Figure 10:
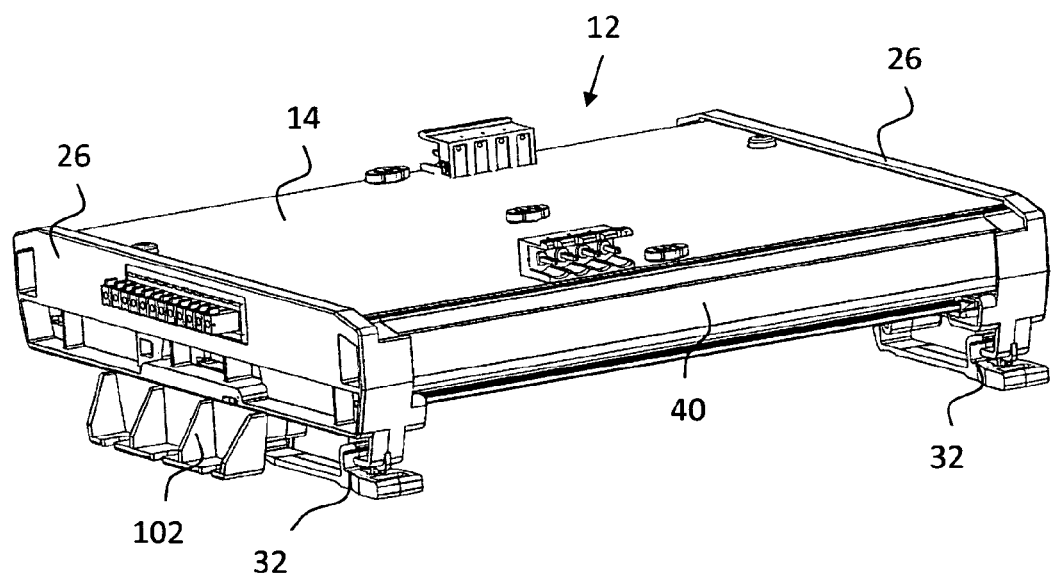
FIG. 10 shows a schematic view of a module unit according to an embodiment of the invention fastened to a fastening flange.

FIG. 10 shows a module unit according to an embodiment of the invention, which is not mounted on a support rail, but on a fastening flange 102.

Figure 11:
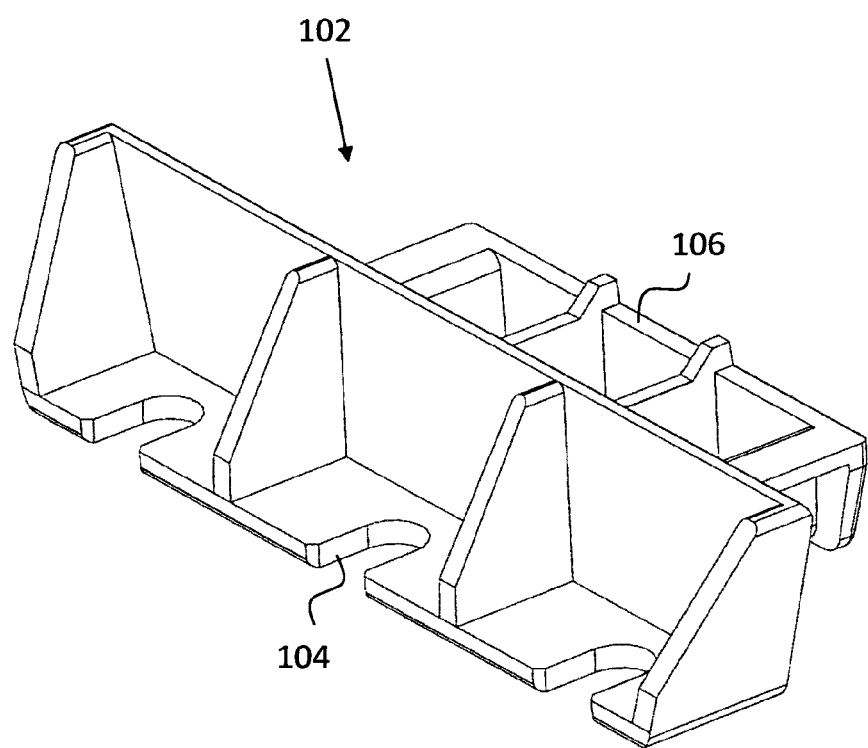
FIG. 11 shows a schematic view of the fastening flange shown in FIG. 10.

FIG. 11 shows an example of a fastening flange 102 of this type in detail, the fastening flange 102 having a plurality of bores 104 to receive screws, by means of which the fastening flange 102 and therefore the module unit can be mounted, for example, on a wall of a switching cabinet. The fastening flange 102 can be fastened on a lateral element 26 arranged on the receiving element 12, for example by means of a hook-in element 106, so the lateral elements 26 can be latched onto a fastening flange 106, as on a support rail. Advantageously, the fastening flange 106 does not have to be unscrewed to disassemble the lateral elements 26 from the fastening flange 106.

While the invention has been described with reference to particular embodiments thereof, it will be understood by those having ordinary skill the art that various changes may be made therein without departing from the scope and spirit of the invention. Further, the present invention is not limited to the embodiments described herein; reference should be had to the appended claims.

LIST OF REFERENCE NUMERALS support rail 10
receiving element 12
second circuit board 14
third circuit board 16
first circuit board 18
fastening element 20
lateral region 22
terminal 24
lateral element 26
opening 28
plug connector arrangement 30
foot element 32
foot element 34
potential earth contact element 36
base plate 38
holding element 40
web element 42
recess 44
latching means 46
guide element 48
hollow chamber profile 50
rib element 52
locking element 54
opening 56
latching hook 58
spring arm 62
latching hook 64
bevelled face 66
portion 68
portion 70
through-opening 72
shaft 74
holding element 76
latching element 78
undercut 80
metal arm 82
clamp 84
holding element 86
recess 88
undercut 90
longitudinal direction 92
locking element 94
opening 96
latching hook 98
fastening flange 102
bore 104
hook-in element 106
insertion direction 108

The invention claimed is:

1. A module unit, comprising:
a receiving element formed from an extrusion profile that extends in a longitudinal direction, the receiving element including a base plate, the receiving element including a first and a second holding element that extend in the longitudinal direction and are respectively disposed on opposite sides of the base plate, the first holding element including a first insertion groove that extends in the longitudinal direction and is configured to receive a first edge region of at least one circuit board and the second holding element including a second insertion groove that extends in the longitudinal direction and is configured to receive a second, opposite edge region of the at least one circuit board so as to dispose the at least one circuit board between the first and second holding elements, the base plate including a web element and at least two recesses formed into the web element; and
first and second lateral elements each including a guide element and a latching mechanism disposed in a region of the guide element, the latching mechanisms each being configured to be received in a respective one of the at least two recesses so as to latch the lateral elements to the receiving element,
wherein at least one of the two lateral elements includes an opening.

2. The module unit according to claim 1, wherein the lateral elements are pushable onto the web element by means of the guide elements.

3. The module unit according to claim 1, further comprising at least one fastening element configured to fasten the at least one circuit board on the receiving element.

4. The module unit according to claim 1, further comprising at least one potential earth contact element.

5. The module unit according to claim 1, further comprising a foot element configured to fasten at least one of the receiving element and one of the two lateral elements on a support rail.

6. A method for producing the receiving element for the module unit of claim 1, comprising:
   providing the extrusion profile; and
   cutting the extrusion profile to a length of the receiving element and, simultaneously with the cutting, providing the receiving element with the recesses.

7. The method according to claim 6, wherein the cutting is performed using a main saw blade of a saw device and the providing the receiving element with the recesses is performed at one end of the receiving element being cut and at a starting end of a next receiving element to be cut using two additional saw blades of the saw device.

8. A module unit, comprising:
   a receiving element formed from an extrusion profile that extends in a longitudinal direction, the receiving element including a base plate, the receiving element including a first and a second holding element that extend in the longitudinal direction and are respectively disposed on opposite sides of the base plate, the first holding element including a first insertion groove that extends in the longitudinal direction and is configured to receive a first edge region of at least one circuit board and the second holding element including a second insertion groove that extends in the longitudinal direction and is configured to receive a second, opposite edge region of the at least one circuit board so as to dispose the at least one circuit board between the first and second holding elements, the base plate including a web element and at least two recesses formed into the web element; and
   first and second lateral elements each including a guide element and a latching mechanism disposed in a region of the guide element, the latching mechanisms each being configured to be received in a respective one of the at least two recesses so as to latch the lateral elements to the receiving element,
   wherein the at least one circuit board includes at least a first circuit board and a second circuit board, wherein the holding elements are each configured to surround, in a U-shape, one of two opposing lateral regions of the first circuit board and to support one of two mutually opposing lateral regions of the second circuit board.

9. The module unit according to claim 8, wherein each of the two holding elements include at least one hollow chamber profile configured to receive a respective rib element disposed on one of the lateral elements.

10. A module unit, comprising:
   a receiving element formed from an extrusion profile that extends in a longitudinal direction, the receiving element including a base plate, the receiving element including a first and a second holding element that extend in the longitudinal direction and are respectively disposed on opposite sides of the base plate, the first holding element including a first insertion groove that extends in the longitudinal direction and configured to receive a first edge region of at least one circuit hoard and the second holding element including a second insertion groove that extends in the longitudinal direction and is configured to receive a second, opposite edge region of the at least one circuit board so as to dispose the at least one circuit board between the first and second holding elements, the base plate including a web element and at least two recesses formed into the web element; and
   first and second lateral elements each including a guide element and a latching mechanism disposed in a region of the guide element, the latching mechanisms each being configured to be received in a respective one of the at least two recesses so as to latch the lateral elements to the receiving element,
   further comprising at least one fastening element configured to fasten the at least one circuit board on the receiving element,
   wherein the at least one circuit board includes a through-opening and the at least one fastening element includes a holding element, the at least one fastening element being guidable through the through-opening and fastenable to the at least one circuit board, by means of the holding element, by a rotational movement of the at least one fastening element on a surface of the at least one circuit board.

* * * * *